United States Patent
Vanstone et al.

(10) Patent No.: US 6,668,180 B1
(45) Date of Patent: Dec. 23, 2003

(54) SIGNALING METHOD AND APPARATUS WITH A HOST AND HUMAN INPUT DEVICE

(75) Inventors: Mark Vanstone, Camarillo, CA (US); Andrew Shafranov, Camarillo, CA (US); Victor Marten, Flushing, NY (US)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 10/311,734

(22) PCT Filed: May 24, 2002

(86) PCT No.: PCT/US02/16741
§ 371 (c)(1),
(2), (4) Date: Jan. 8, 2003

(87) PCT Pub. No.: WO02/098007
PCT Pub. Date: Dec. 5, 2002

(51) Int. Cl.$^7$ .............................. H04B 1/38; H04M 1/00
(52) U.S. Cl. ........................................................ 455/574
(58) Field of Search ......................................... 455/574

(56) References Cited

U.S. PATENT DOCUMENTS 5,701,582 A  12/1997  Debay

FOREIGN PATENT DOCUMENTS

WO      WO 00/60438       10/2000

*Primary Examiner*—William Cumming
(74) *Attorney, Agent, or Firm*—Oppedahl & Larson LLP

(57) ABSTRACT

In the exemplary system, a "software" handshake is employed to signal from the keyboard when it is desired to "wake up" the host. After the handshake is completed, a key scan code is communicated to the host. Thereafter the host may revert to "sleep" mode until another keystroke (press or release) occurs. This helps to conserve power and increase battery life.

11 Claims, 2 Drawing Sheets

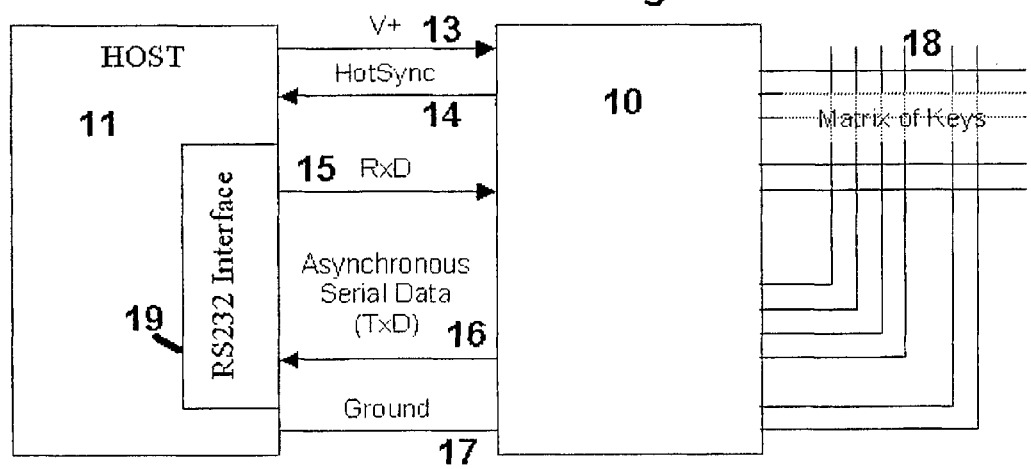

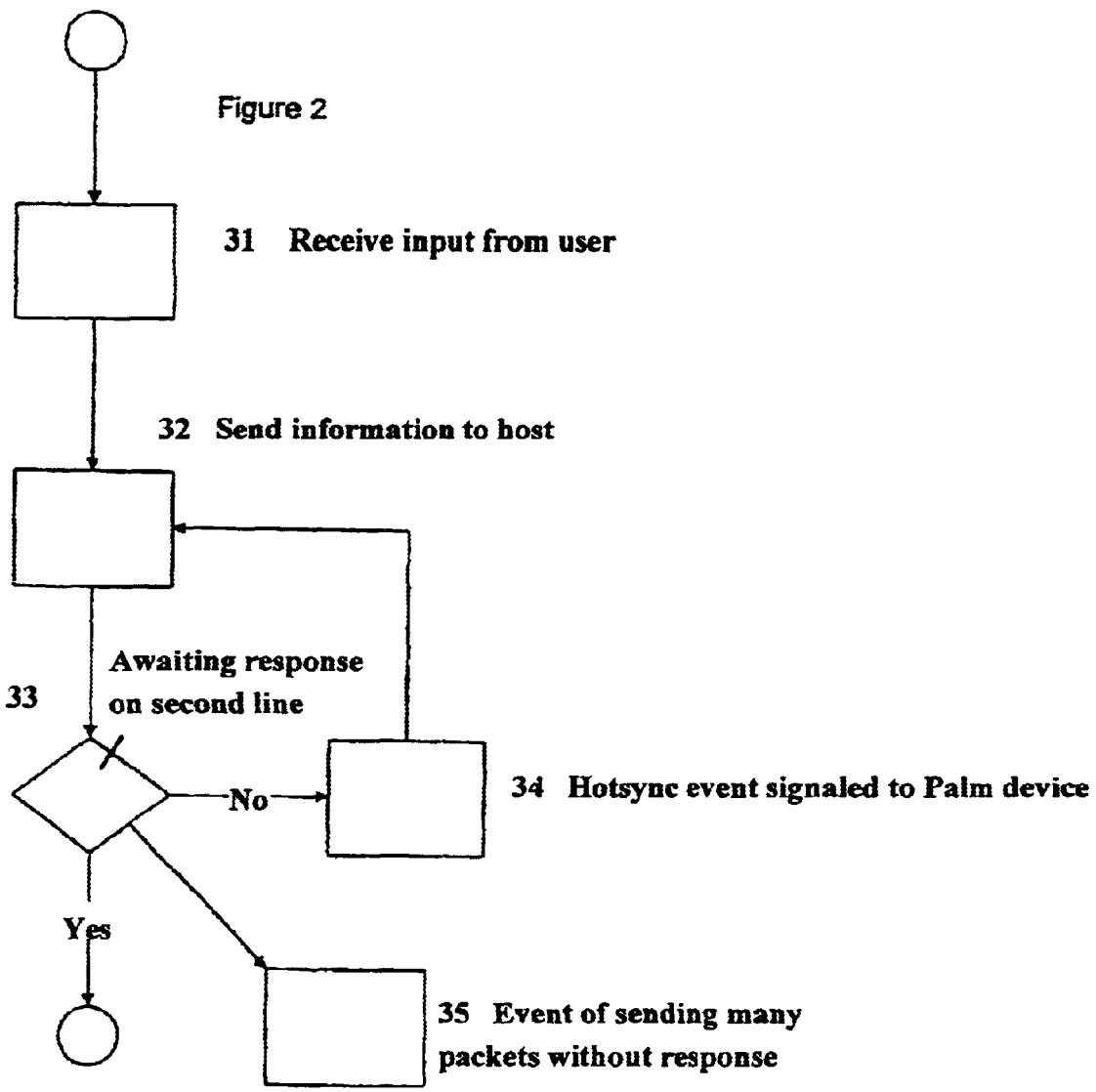

SIGNALING METHOD AND APPARATUS WITH A HOST AND HUMAN INPUT DEVICE

The application claims priority from copending U.S. appl. No. 60/293,627, filed May 25, 2001, incorporated herein by reference.

The invention relates generally to signaling between a host and a human-input device such as a keyboard, and relates more particularly to such signaling in systems where it is desired to minimize power consumption and maximize battery life.

BACKGROUND

The earliest personal computers were powered by AC (mains) power and thus there was little need to worry about power consumption. Such computers were also stationary rather than portable and thus there was little need to worry about weight or size. Such a computer typically has a keyboard that is roughly the size of a traditional typewriter keyboard. The keys are typically laid out with the keys "Q," "W," "E," "R," "T," and "Y" in a row, and the keyboard is sometimes called a "QWERTY" keyboard.

In more recent times, however, consumers have shown greater interest in computers that are small and light in weight. A typical "personal digital assistant" or PDA is small enough to fit into a shirt pocket and weighs less than a pound. The PDA form factor is possible only because the designer forgoes a conventional keyboard and pointing device. The default mode of human input with such a host is a stylus applied to a touch-sensitive display screen.

A natural next step is to attempt to interface a QWERTY keyboard with a PDA. As it turns out, there are several reasons why this is not easy. First, the PDA will probably not have been designed from the outset to connect with a keyboard at all. Second, the I/O port or ports provided by the PDA designer will probably be poorly documented or not documented at all, and will not be well suited to use by a third-party designer of human input devices. Third, the operating system of the PDA will probably be poorly documented, and latency in responding to interrupts and other asynchronous inputs is likely to be variable and not easy to predict.

Finally, the PDA will have been designed to minimize power consumption and thus to maximize battery life, and the design decisions that minimize power consumption tend to disfavor other potential design goals. For example, the PDA will have at least two power consumption levels, a higher level which displays information and responds to user inputs, and a low-power or "sleep" level which preserves memory contents and otherwise consumes only the power required to respond to any of certain defined "wake-up" inputs.

One popular PDA is the Palm Pilot, which has a "hot sync" port used with a cradle for synchronization of a database between the PDA and a personal computer. The cradle connects to the personal computer by means of a serial data port. The interface between the PDA and the cradle is a serial interface with other pins for power and ground and handshaking. The cradle has a "sync" button which (among other things) communicates a "wake-up" signal to the PDA if it is not already awake, and readies the PDA for the "hot sync" procedure.

Given that the only workable I/O port may be the "hot sync" port, the designer of an external keyboard may well find that there is no choice but to attempt to interface with that port. The designer will, ideally, be able to design a "driver" which is loaded into the RAM of the PDA, which driver is to receive signals from the keyboard and to provide them to the operating system. In this way, a keystroke at the keyboard will be communicated to the operating system in a way which brings about the same results as a keystroke communicated to the operating system by other means. The designer must, however, necessarily attempt to take account of the possibility that the PDA maybe be in "sleep" mode at the time that a key is pressed by a user. The keyboard would then need to buffer the key-press information, awaken the PDA, and pass the key-press information to the driver (and thence to the operating system).

Experience shows, however, that there is much to go wrong in such a system.

A signaling method directed to these ends is described in International Patent Application no. PCT/US00/08521, published Oct. 12, 2000 as WO 00/60438, page 32, line 30 to page 39, line 25, and FIG. 33.

In a prior-art system, the keyboard encoder of the keyboard has a serial interface and is designed for use with a Palm Pilot PDA running the Palm Operating System (Palm OS), with emphasis on low power consumption. The encoder is connected to the Host PDA via five wires. Two lines (V+ and Ground) provide operating power, and three lines provide the interface. One interface line is "Request-to-Send" (RTS) which provides a hardware handshake. If RTS is asserted, this means the serial interface is active. If RTS is not asserted then the serial interface is not active, for example, during a "sleep" condition of the PDA. Another interface line is the HotSync line, which is an Interrupt pin with wake-up capability connected directly to the main CPU in the Host.

It is helpful to define an "Idle time" for the serial interface of the host, defined as the time when the RS232 Interface is activated, but no data transmissions occur. Experience shows that the RS232 Interface in the Host consumes power during both Idle time and the actual receive operations. In order to reduce the power consumption, it is paramount to reduce the Idle time. Depending on the operations of the Driver in the Host, the Idle time might be reduced to 3 seconds or less (and perhaps as little as 300 ms). The fortunate result (from the power-conservation point of view) is that the Encoder (and external keyboard) may turn out almost to have no impact on the total average power consumption of the whole system, and the service life of a single set of batteries is essentially the same with or without the Encoder attached to the Host.

Importantly, permitting both the Encoder IC and the Host to shift into "stopped" or very-low-power operations make it possible to achieve a small average operating power.

With the prior-art system, when the key is actually pressed, the Encoder IC is awakened first, and after a brief processing and verification delay, the Host is aroused too by activation of the HotSync line. While the designers of the Palm specifically designed the HotSync pin for this purpose, it can serve the more general function of indicating manually to the PDA that some new external device or cabling has just been attached. For example, if the user presses a button, this usually evokes the HotSync signal. The exemplary prior-art chip simulates the button press with the digital output pin, activating the HotSync line quite often. As will be appreciated, in practical terms it may develop that the HotSync line is activated for nearly every keystroke.

With the prior-art system, the basic operations can be described as:

1. Sensing a key press on the key matrix 18;
2. Looking at the RTS line to determine if the RS232 Interface is active;
   a. If RTS is not active, then pulsing the HotSync line 14;
   b. waiting for RTS line to become active;
   c. And possibly repeating the HotSync if the previous one wasn't acknowledged by the actions of the RTS line (e.g. it was lost, for some unknown reason, in the OS);
3. Sending the Report of the Key Press to the Host 11;
4. Waiting for the key to be released while reporting any new keys using method of #1 through #3;
5. When key is released—sending the release information to the Host 11;
6. When all keys are released (that is, when the keyboard is idle), the IC 10 reduces its power consumption to almost zero;
7. When all of the keys are released (the keyboard is idle), the Driver may de-activate the RS232 port (and RTS line).

Using the above steps in the operations of the complete Host-Encoder system, a dramatic reduction of power consumption is achieved.

There are, however, difficulties with this approach. For example, experience shows that the response of the Host to the HotSync and the handling of the Serial Port is not instantaneous and deterministic. The Palm OS is a multi-tasking OS, and execution delays can depend on exactly what the Host is doing at the present time. Particularly troublesome is the fact that the Host's response to the Driver's request for closing of the Serial port may be quite long (in the 50–300 ms range) and may vary significantly. The Serial port's data path is made inactive (and all data is lost) before the RTS line changes its state to inactive. The proper method would be to de-active the RTS line, wait for one Byte-time (to assure that the current transmission completes normally), and only then disable the receive data path and the buffers. However, the Palm OS does not use the "proper method," but instead disables the receive data path and the buffers very shortly after deactivation of the RTS line.

Experience shows that the response time for a HotSync pulse is also very slow, from 100 ms to as much as 500 ms or more. Experience shows that the response time is most often in the shorter end of the range, but that sometimes the host responds only very slowly to that pulse.

In such a system, when the Driver determines that the keyboard is Idle, it issues commands to the Palm OS to negate the RTS line and to close the Serial port (in order to conserve energy). Due to the above-described Palm OS behavior, if the user taps the key at the exact moment just before the Driver has decided to close the Serial port, the data from that key press will be lost (the IC observes the RTS line to be active/high and therefore sends the data without initiating the HotSync procedure, while the port's data path is already deactivated). It turns out that the window of opportunity for this error is quite high, perhaps on the order of 100 ms, and changeable depending on the present status of the OS.

To attempt to reduce this problem, the prior-art chip checks the state of the RTS line for 300 ms following a transmission. If RTS did not change to the inactive state during this time, the transmission was deemed successful. If RTS changes to the inactive state during this 300 ms period, a set of specific rules is evoked to determine how much of the data needs to be retransmitted. This approach turns out not to be optimal. For example, from the discussions of the Palm OS problems, it is clear that even a valid active indication from the RTS line cannot be trusted. It is possible to lose keystrokes.

It would thus be extremely desirable to provide an interface between a keyboard and such a host, that faces only a much smaller risk of loss of keystrokes, and yet that fulfills the power-conservation goals described above.

SUMMARY OF THE INVENTION

In the exemplary system, a "software" handshake is employed to signal from the keyboard when it is desired to "wake up" the host. After the handshake is completed, a key scan code is communicated to the host. Thereafter the host may revert to "sleep" mode until another keystroke (press or release) occurs. This helps to conserve power and increase battery life.

DESCRIPTION OF THE DRAWING

The invention is described in connection with a drawing, of which:

FIG. 1 is a functional block diagram showing communication between the keyboard and the host; and FIG. 2 is a flowchart showing some of the steps of the invention.

DETAILED DESCRIPTION

There are three possible starting points for all interaction between the Palm device and the device according to the invention. These are defined thus:

PowerUp—The Palm device is connected to the device according to the invention, the device powers itself up and initializes itself, sends an IDRQ signal (a packet that asks whether the driver is present and what version of driver it is), then DAKU (a packet which indicates that no further exchanges of data are presently needed) and then goes to sleep.

WakeUp—The device according to the invention detects an internal event (typically a keypress), wakes up, and begins the process to handshake the data to the Palm.

Disturb—The device according to the invention detects a transmission on the data lines from the Palm, and starts a Resync procedure. This is used by the driver to detect the presence of a device according to the invention.

Following these startpoints, there are standard procedures which are also defined here.

Send Data—This is a routine to send data from the device according to the invention to the Palm device.

Resync—This is a routine to re-initialize communication between the device according to the invention and the Palm device.

Idle—This is a routine where the device according to the invention is semi-asleep, doing minimal processing such as timeouts, key release detection and key debounce.

Sleep—This is a state in which the device according to the invention is in deep sleep and can only be awakened by WakeUp or Disturb events.

Turning now to FIG. 1, what is shown is a functional block diagram of the host and the inventive interface device.

Host 11 is, typically, a Palm PDA. It has an RS232 interface 19 forming part of the hotsync connector at the base of the PDA. The connector has a ground line 17, a positive-voltage power line 13, a serial line 15 by which data leave the PDA, a serial line 16 by which data enter the PDA, and the above-mentioned hotsync line 14. These lines, together with at least one other line omitted for clarity in FIG. 1, define an interface to the above-mentioned hotsync cradle.

The inventive interface chip 10 is described in more detail below. It connects with a keyboard matrix 18, with enough row and column lines to define an array with intersections for each of the keys on the keyboard. As will be clear from the discussion that follows, the invention can offer its benefits with other human inputs as well, for example, position data from a pointing stick embedded in the keyboard.

As a general matter, keyboard data is sent to the Palm when a key is pressed. If data is sent from the Palm device 11 to the inventive device 10 (on line 15), the inventive device 10 will respond (on line 16) with a Resync and DAKU as the transmitted data. This would happen if the driver wanted to confirm the presence of the inventive device 10.

When a key within the key matrix 18 is pressed, the inventive device 10 wakes up and sends the data packet (indicative of the key press) to the Palm device 11 on line 16 (FIG. 2, reference numeral 32). This packet is used to determine if the Palm is still awake, the serial port 19 open and the driver connected.

If this packet is ignored by the Palm 11, the inventive device 10 signals a hotsync event to the Palm 11 on line 14 (FIG. 2, reference numeral 34). This hotsync event is long enough to be recognized by the Palm, but short enough that a standard Palm with no driver installed may (preferably) discard this event as a 'non-debounced' hotsync event. This means that the installed low-level driver must respond first and very quickly to the hotsync event.

After the inventive device 10 signals a hotsync on line 14 (FIG. 2, reference numeral 34), it waits for a period ($T_{HSBO}$, typically 100 msec) and sends an IDRQ packet on line 16.

It will then keep sending IDRQ packets at intervals of 20 mS until either the Palm device 11 responds which is the usual result, or some number of packets (preferably 40) packets have been sent (FIG. 2, reference numeral 35). In that event (the failure of response by the device 11) an additional hotsync will be attempted, followed by sending of more IDRQ packets. If communications has not been established after a predetermined number of hotsync events (each followed by 40 IDRQ requests), then the system will conclude that the host 11 is not capable of communications, and the device 10 will enter a total shutdown, thus protected against unintended and unnecessary discharge of the batteries in the host 11. In one embodiment the number of hotsync attempts is three.

If the Palm device 11 responds (on line 15) with the IDRQ ACK packet (a packet that signifies acknowledgment of the IDRQ packet), the keyboard then resends the keyboard DATA packet (on line 16) (FIG. 2, reference numeral 32). This is the packet indicative of the key event such as the press or release of a key. If the key is held down, the inventive device 10 will wait until the key is released (or until ~10 minutes has passed), and then sends another key packet (on line 16) representing a key release.

In an exemplary embodiment, the driver and the device 10 are configured so that flag bits within the data packet indicate whether the event is a key press or a key release. If the key event was a key release, the 'break' flag will be set, otherwise the 'make' flag will be set.

If the inventive device 10 detects that there are no more keys pressed, it will then send a 'DAKU' packet (on line 16) informing the Palm device 11 that there are no more keys pressed. If somehow a key release was not received/sent, this will stop the Palm device 11 from mistakenly interpreting the events as an auto-repeat of the key.

It is helpful to describe the process in terms of the sequence of steps that is followed.

By way of review, the process is used with a system comprising a host 11 and a human-input device (e.g. reference numerals 10 and 18), the host and human-input device connected by an interface, the interface comprising first, second, third, and fourth lines; the first line 14 defining a quiescent level and a non-quiescent level. The non-quiescent level is the "hotsync" signal that is intended to "wake up" the host 11 if it is not awake.

The second line 15 defines a synchronous serial data line from the host to the human-input device; the third line 16 defines an asynchronous serial data line from the human-input device to the host; and the fourth line 17 defines a ground reference.

The human-input device comprises an input means 18 disposed to receive inputs from a user; the human-input device further comprising a control means 10 communicatively coupled with the input means and communicatively coupled with the first, second, and third lines.

The control means 10 is responsive to the input from the user by sending information indicative of the input from the user on the third line 16 to the host 11, and by awaiting a response thereto on the second line 15 from the host 11 within a predetermined interval, and in the absence of the response thereto within the predetermined interval, causing the first line 14 momentarily to be at the non-quiescent level, thereafter again sending information indicative of the input from the user on the third line 16 to the host 11.

The interface further optionally comprises a fifth line 13 providing direct-current power from the host 11 to the human-input device, wherein the human-input device comprises a keyboard having keys, wherein the input from the user comprises a press of one of the keys, and wherein the information indicative of the input from the user comprises a report of the press of one of the keys.

The method comprises the steps of:
(reference numeral 31 of FIG. 2) receiving, at the human-input device 18, a first input from the user;
(reference numeral 32) sending information indicative of the first input from the user on the third line 16 to the host 11;
(reference numeral 33) awaiting a first response thereto on the second line 15 from the host 11 within a predetermined interval;
in the absence of the first response thereto within the predetermined interval, (reference numeral 34) causing the first line 14 momentarily to be at the non-quiescent level; and
thereafter again sending information indicative of the first input from the user on the third line 16 to the host 11 (reference numeral 32);
receiving, at the human-input device, a second input from the user (reference numeral 31);
sending information indicative of the second input from the user on the third line 16 to the host 11 (reference numeral 32);
awaiting a second response thereto on the second line 15 from the host 11 within a predetermined interval (reference numeral 33);

in the absence of the second response thereto within the predetermined interval, causing the first line 14 momentarily to be at the non-quiescent level (reference numeral 34); and thereafter again sending information indicative of the second input from the user on the third line 16 to the host 11 (reference numeral 32);

the second response being different from the first response.

The method may additionally involve the steps of:

again awaiting a first response thereto on the second line 15 from the host 11 within the predetermined interval (reference numeral 33);

in the absence of the first response thereto within the predetermined interval, causing the first line 14 again momentarily to be at the non-quiescent level (reference numeral 34); and thereafter a third time sending information indicative of the first input from the user on the third line 16 to the host (reference numeral 32).

It will be appreciated that before the receiving step can happen, it is necessary to install in the host 11 a driver (reference numeral 30) responsive to information indicative of user inputs on the third line 16 by sending a response thereto to the human-input device on the second line 15.

It will be further appreciated that the control means 10 can desirably be put into a low-power state between inputs from the user at the human-input device. For example, between events in the key matrix 18 the control means 10 may go to "sleep."

Another possible sequence of events will now be described.

A first input from a user is received at the input device 18 (reference numeral 31).

Information indicative of the first input from the user is sent on the third line 16 to the host 11 (reference numeral 32).

A first response thereto on the second line 15 from the host 11 is awaited within a predetermined interval (reference numeral 33).

In the absence of the first response thereto within the predetermined interval, the first line 14 is momentarily caused to be at the non-quiescent level (reference numeral 34).

Thereafter the information indicative of the first input from the user is again sent on the third line 16 to the host 11 (reference numeral 32).

The system may then await a first response thereto on the second line 15 from the host 11 within the predetermined interval (reference numeral 33).

In the absence of the first response thereto within the predetermined interval, the first line 14 is again caused momentarily to be at the non-quiescent level (reference numeral 34).

Thereafter information indicative of the first input from the user is yet again sent on the third line 16 to the host 11 (reference numeral 32).

If a second input is received at the human-input device from the user (reference numeral 31), the information indicative of the second input from the user is sent on the third line 16 to the host 11 (reference numeral 32).

A second response thereto on the second line 15 from the host 11 is awaited within a predetermined interval (reference numeral 33).

In the absence of the second response thereto within the predetermined interval, the first line 14 is caused momentarily to be at the non-quiescent level (reference numeral 34).

Thereafter information indicative of the second input from the user is sent on the third line 16 to the host 11 (reference numeral 32), the second response being different from the first response.

Preferably, if a single key or groups of keys are stuck in the depressed position, the IC 10 will enter a total shutdown after a 10-minute wait, thus protecting against unintended and unnecessary discharge of the batteries in the Host 11.

The approach described here offers some advantages over the prior art. When the inventive chip needs to know if the Host's Serial port is ready to receive data, it simply sends a request "token" to the Host, and awaits the specific acknowledgment. The built-in error detection makes the whole process very reliable and fast (as the Palm operating system turns out to be able to process the Data Bytes faster then the toggling of the control line—it takes less time to send and receive data Bytes then activate the HotSync and wait for the RTS to change the state). Another advantage is that even in the event that the HotSync is necessary, the inventive chip starts to send these request "tokens" as soon as the HotSync is activated, and the actual key press data can be transmitted as soon as the Host returns a correct reply.

Every data packet required a specific (and varying) acknowledgement from the Host. Otherwise, the data packet is repeated until correct response is achieved from the Host, or the HotSync is activated to wake-up the Host. The Data Transmission is thus guaranteed to be lossless.

This built-in data protocol greatly simplifies the operation in abnormal or special situations, making the actions uniform in all situations, without the need to create a specific set of rules for each of the possible eventualities.

While the invention is described with respect to particular apparatus and method steps, the invention is not so limited, but is instead defined by the claims which follow. Those skilled in the art will have no difficulty devising obvious variants and improvements thereof, all of which are within the scope of the invention as claimed. For example, nothing about the invention is limited to keystroke data; the protocol described herein can also accommodate additional types of data if desired; for example, position data from a pointing stick embedded in the keyboard.

What is claimed is:

1. A signaling method for use with a system comprising a host and a human-input device, the host and human-input device connected by an interface, the interface comprising first, second, third, and fourth lines; the first line defining a quiescent level and a non-quiescent level; the second line defining a synchronous serial data line from the host to the human-input device; the third line defining an asynchronous serial data line from the human-input device to the host; and the fourth line defining a ground reference, the human-input device comprising an input means disposed to receive inputs from a user; the human-input device further comprising a control means communicatively coupled with the input means and communicatively coupled with the first, second, and third lines; the method comprising the steps of:

receiving, at the human-input device, a first input from the user;

sending information indicative of the first input from the user on the third line to the host;

awaiting a first response thereto on the second line from the host within a predetermined interval;

in the absence of the first response thereto within the predetermined interval, causing the first line momentarily to be at the non-quiescent level; and thereafter again sending information indicative of the first input from the user on the third line to the host;

receiving, at the human-input device, a second input from the user;

sending information indicative of the second input from the user on the third line to the host;

awaiting a second response thereto on the second line from the host within a predetermined interval;

in the absence of the second response thereto within the predetermined interval, causing the first line momentarily to be at the non-quiescent level; and thereafter again sending information indicative of the second input from the user on the third line to the host;

the second response being different from the first response.

2. The method of claim 1 further comprising the steps of:

again awaiting a first response thereto on the second line from the host within the predetermined interval;

in the absence of the first response thereto within the predetermined interval, causing the first line again momentarily to be at the non-quiescent level; and thereafter a third time sending information indicative of the first input from the user on the third line to the host.

3. The method of claim 1 further comprising the step, performed before the receiving step, of installing in the host a driver responsive to information indicative of user inputs on the third line by sending a response thereto to the human-input device on the second line.

4. The method of claim 1 further comprising the step, performed between inputs from the user at the human-input device, of causing the control means to enter a low-power state.

5. A signaling method for use with a system comprising a host and a human-input device, the host and human-input device connected by an interface, the interface comprising first, second, third, and fourth lines; the first line defining a quiescent level and a non-quiescent level; the second line defining a synchronous serial data line from the host to the human-input device; the third line defining an asynchronous serial data line from the human-input device to the host; and the fourth line defining a ground reference, the human-input device comprising an input means disposed to receive inputs from a user; the human-input device further comprising a control means communicatively coupled with the input means and communicatively coupled with the first, second, and third lines; the method comprising the steps of:

receiving, at the human-input device, a first input from the user;

sending information indicative of the first input from the user on the third line to the host;

awaiting a first response thereto on the second line from the host within a predetermined interval;

in the absence of the first response thereto within the predetermined interval, causing the first line momentarily to be at the non-quiescent level; and thereafter again sending information indicative of the first input from the user on the third line to the host.

6. The method of claim 5 further comprising the steps of:

again awaiting a first response thereto on the second line from the host within the predetermined interval;

in the absence of the first response thereto within the predetermined interval, causing the first line again momentarily to be at the non-quiescent level; and thereafter a third time sending information indicative of the first input from the user on the third line to the host.

7. The method of claim 5 further comprising the step, performed before the receiving step, of installing in the host a driver responsive to information indicative of user inputs on the third line by sending a response thereto to the human-input device on the second line.

8. The method of claim 5 further comprising the steps of:

receiving, at the human-input device, a second input from the user;

sending information indicative of the second input from the user on the third line to the host;

awaiting a second response thereto on the second line from the host within a predetermined interval;

in the absence of the second response thereto within the predetermined interval, causing the first line momentarily to be at the non-quiescent level; and thereafter again sending information indicative of the second input from the user on the third line to the host;

the second response being different from the first response.

9. The method of claim 8 further comprising the step, performed between inputs from the user at the human-input device, of causing the control means to enter a low-power state.

10. A signaling system comprising a host and a human-input device, the host and human-input device connected by an interface, the interface comprising first, second, third, and fourth lines;

the first line defining a quiescent level and a non-quiescent level;

the second line defining a synchronous serial data line from the host to the human-input device;

the third line defining an asynchronous serial data line from the human-input device to the host;

and the fourth line defining a ground reference, the human-input device comprising an input means disposed to receive an input from a user;

the human-input device further comprising a control means communicatively coupled with the input means and communicatively coupled with the first, second, and third lines;

the control means responsive to the input from the user by sending information indicative of the input from the user on the third line to the host, and by awaiting a response thereto on the second line from the host within a predetermined interval, and in the absence of the response thereto within the predetermined interval, causing the first line momentarily to be at the non-quiescent level, thereafter again sending information indicative of the input from the user on the third line to the host.

11. The system of claim 10 wherein the interface further comprises a fifth line providing direct-current power from the host to the human-input device, wherein the human-input device comprises a keyboard having keys, wherein the input from the user comprises a press of one of the keys, and wherein the information indicative of the input from the user comprises a report of the press of one of the keys.

* * * * *

UNITED STATES PATENT AND TRADEMARK OFFICE
CERTIFICATE OF CORRECTION

PATENT NO.   : 6,668,180 B1
DATED        : December 23, 2003
INVENTOR(S)  : Vanstone et al.

It is certified that error appears in the above-identified patent and that said Letters Patent is hereby corrected as shown below:

Title page,
Insert Item:
-- [60]          Related U.S. Application Data
Provisional Application No. 60/293,627, filed on 5/25/2001 --

Column 2,
Line 8, change "maybe" to -- may --

Column 3,
Line 39, change "de-active" to -- deactive --

Column 5,
Line 3, change "leave" to -- leaves -- and "enter" to -- enters --

Column 8,
Line 23, change "required" to -- requires --

Signed and Sealed this

Twenty-second Day of March, 2005

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,668,180 B1 | Page 1 of 1 |
| APPLICATION NO. | : 10/311734 | |
| DATED | : December 23, 2003 | |
| INVENTOR(S) | : Vanstone et al. | |

It is certified that error appears in the above-identified patent and that said Letters Patent is hereby corrected as shown below:

<u>Title page,</u>
Insert Item:
-- [60]    Related U.S. Application Data
Provisional Application No. 60/293,627, filed on 5/25/2001 --

<u>Column 2,</u>
Line 8, change "maybe" to -- may --

<u>Column 3,</u>
Line 39, change "de-active" to -- deactivate --

<u>Column 5,</u>
Line 3, change "leave" to -- leaves -- and "enter" to -- enters --

<u>Column 8,</u>
Line 23, change "required" to -- requires --

This certificate supersedes Certificate of Correction issued March 22, 2005.

Signed and Sealed this

First Day of May, 2007

JON W. DUDAS
*Director of the United States Patent and Trademark Office*